United States Patent [19]

Wooten

[11] 4,443,755

[45] Apr. 17, 1984

[54] TEST APPARATUS FOR CIRCUIT BOARD RACKS

[76] Inventor: James F. Wooten, 3435 Walnut Bend #3116, Houston, Tex. 77042

[21] Appl. No.: 328,448

[22] Filed: Dec. 7, 1981

[51] Int. Cl.³ .............................................. G01R 19/00
[52] U.S. Cl. ........................................................ 324/66
[58] Field of Search .................... 324/51, 52, 66, 73 R

[56] References Cited

U.S. PATENT DOCUMENTS 3,500,457 3/1970 Curley .............................. 324/51 X

OTHER PUBLICATIONS

Fosbury et al.; "Self Contained, Handheld, Electronic I/O Cable Tester"–IBM Bulletin–Dec. 1981–pp. 3122-3123.
Johnson: "Programmable Cable Tester Spots Opens and Shorts", Electronics–vol. 47–No. 17–pp. 110-112–Aug. 22, 1974.
Ferrie: "In Circuit IC Tester..." Electronics, May 30, 1974, pp. 120-121.

*Primary Examiner*—Stanley T. Krawczewicz
*Assistant Examiner*—Jose M. Solis
*Attorney, Agent, or Firm*—Neal J. Mosely

[57] ABSTRACT

An electronic test apparatus is provided for evaluating continuity of connections between the pin connectors of a supporting rack for printed circuit boards or the like. Circuit board racks have been provided to receive a plurality of separate modular circuit boards, each of which has a plurality of conductor fingers which fit pin connections or the like in the card (or board) edge connector at the rear of the circuit board supports. The pin connectors for each board are wired together in a selected sequence according to the circuit being constructed by the modules. The test apparatus consists of an electronic circuit including signal lights (LEDs) associated with each pin on card edge connector for the first board slot in the rack to be tested and separate electronic circuits including signal lights (LEDs) associated with each of the pins in each of the other slots in which board modules are to be inserted. When the master circuit is energized for any selected pin in the first slot, the light for that pin will be turned on and the circuit will be completed to and the lights illuminated for the pins for the other slots to which that pin is connected. The master circuit provides for sequencing the connections to the respective pins, thus illuminating in sequence the lights corresponding to each of the pins in the first slot and the lights corresponding the respective pins to which those pins are connected. A probe is also provided for testing for shorts in the equipment.

16 Claims, 6 Drawing Figures

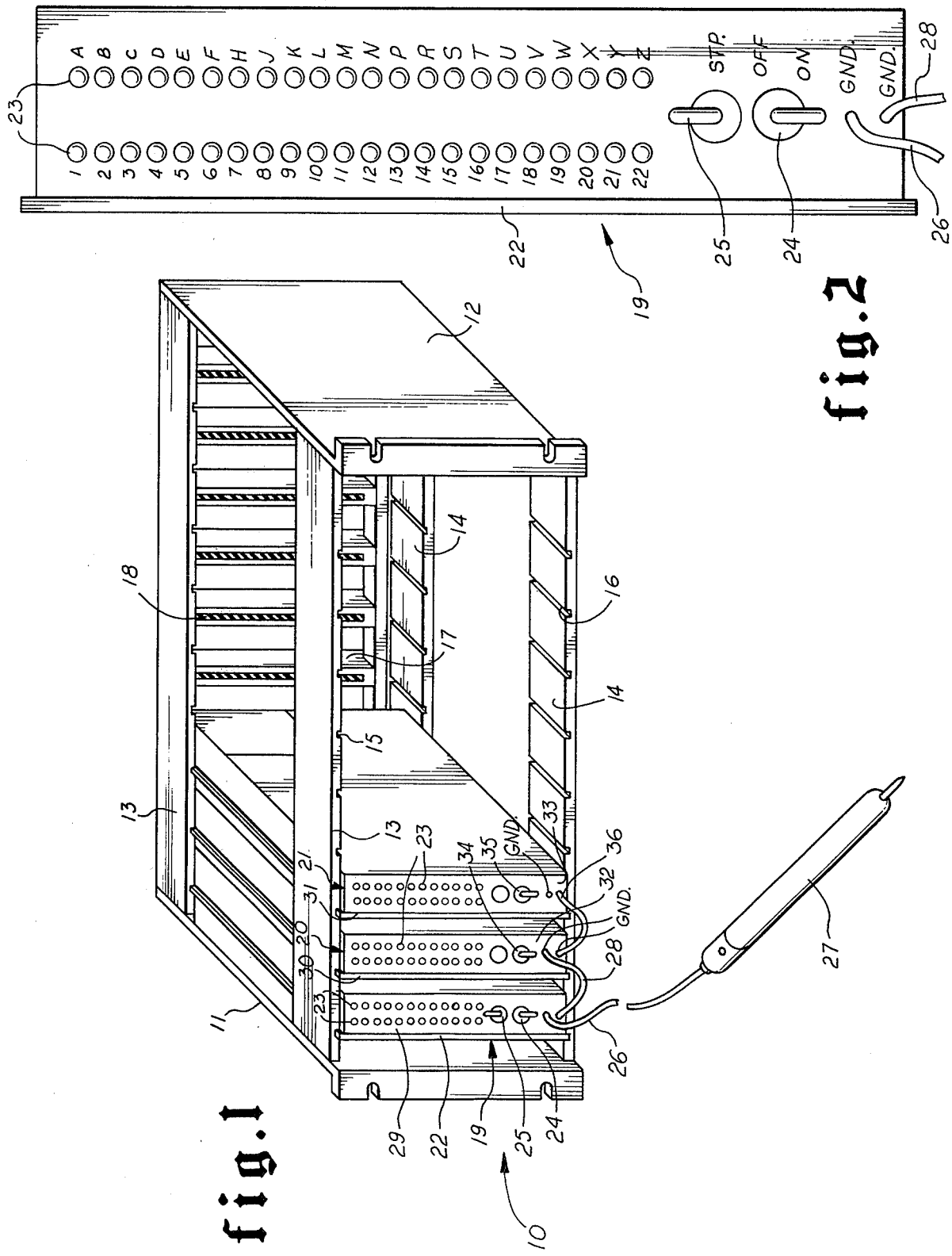

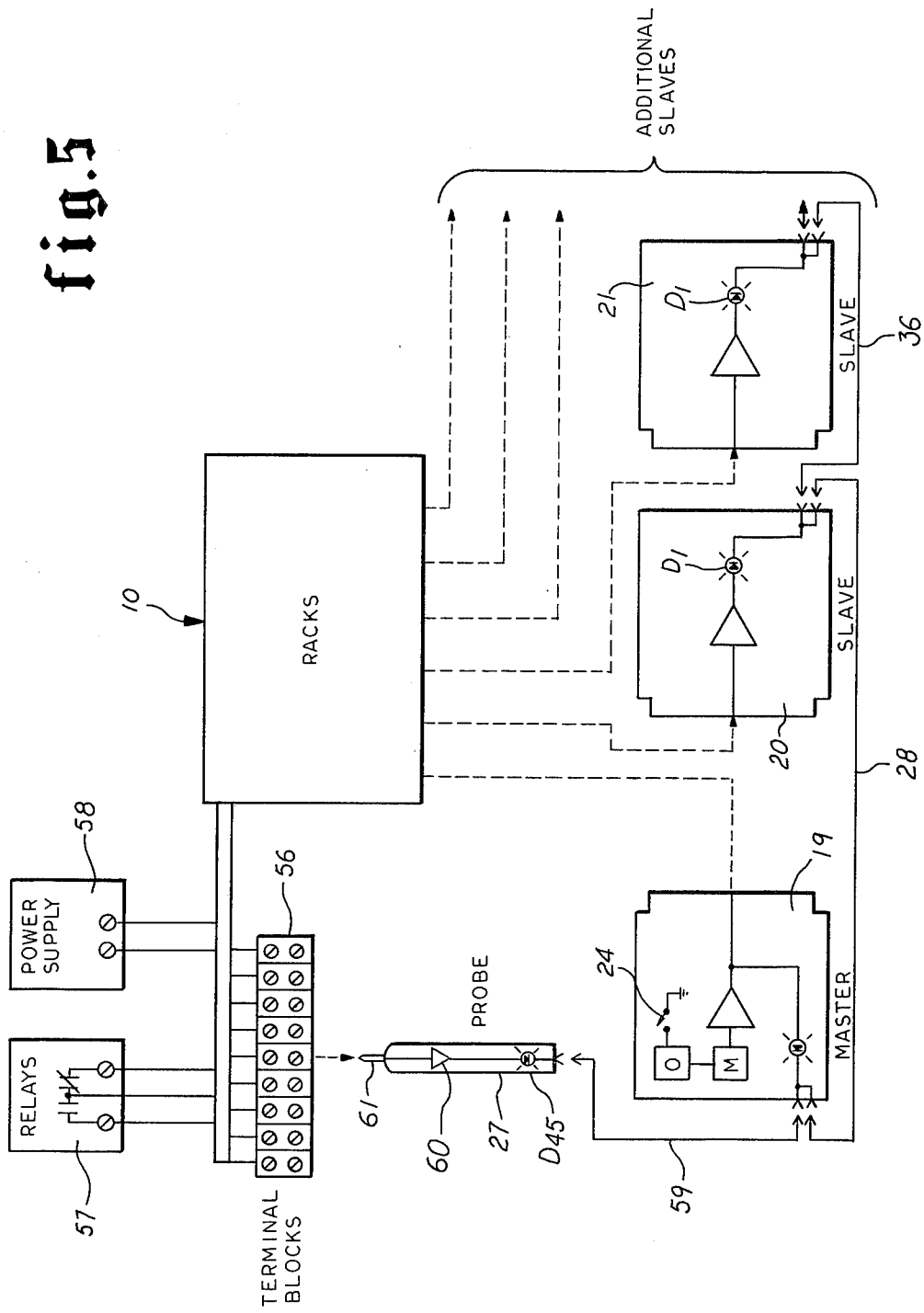

TEST APPARATUS FOR CIRCUIT BOARD RACKS

BACKGROUND OF THE INVENTION

1. Field of the Invention

This invention relates to new and useful improvements in electrical test apparatus and more particularly to a test apparatus for testing the continuity of electrical connections in a rack for supporting circuit boards in an electrical apparatus having a plurality of separate printed circuit board modules.

2. Description of the Prior Art

In recent years, electronic equipment has often been made in the form of a plurality of printed circuit board modules which are supported in slots or other equivalent support in a rack or frame. The circuit board racks have a plurality of pin connectors which fit conductor fingers or the like on the circuit boards which are supported in the rack. The pin connectors are located in card edge connectors at the rear end of the circuit board rack and are therefore often relatively inaccessible for testing. The pin connectors or the like at the rear of the circuit board rack are wired to selected connectors on adjacent circuit board supports to provide the necessary interconnections between selected circuit components on the various racks to provide the complete electrical circuit. The wiring of the connections between the connectors on the slots or supports for the circuit boards is usually done manually and it is necessary to check the connections for continunity to be sure that the proper pin connectors for one board is connected to the proper pin connector for any other board. It is also necessary to check for continunity to determine the possible presence of shorts or of misconnections in the wiring. In the past, it has been necessary to check the wiring of circuit board racks manually using a suitable conductivity meter or signal light and to check the continuity of each separate connector on any given circuit board to the point of connection on the other circuit boards according to the wiring diagram for connecting the various modular circuits.

Buck U.S. Pat. No. 2,951,185 discloses electrical equipment consisting of a chassis or supporting rack having a socket with connectors which receive the connectors on a circuit board module. The chassis is designed to contain a substantial number of separate modular circuits. This apparatus is provided for testing continuity of the circuits on individual circuit boards.

Schmitz U.S. Pat. No. 3,129,991 discloses a printed circuit board rack assembly.

Schaefer U.S. Pat. No. 3,673,397 discloses an electronic circuit tester for testing continunity of circuits on a printed circuit board.

Vinsani U.S. Pat. No. 3,824,462 discloses a test apparatus for testing printed circuit boards.

Berard U.S. Pat. No. 3,953,797 discloses an electronic modular test card which is insertable into a circuit board rack for testing continuity of circuits in circuit boards.

Sullivan U.S. Pat. No. 4,056,773 discloses a test apparatus for detecting open circuits in printed circuit board connectors. The test apparatus includes an array of signal lights (LEDs) for indicating continuity in circuits.

Deegan U.S. Pat. No. 4,087,747 discloses an electronic test apparatus for testing circuit components, circuit assemblies and circuit cards or boards having a plurality of probe contact points.

Wolk U.S. Pat. No. 4,092,593 discloses a circuit board testing machine for positioning one or more test probes relative to a circuit board and wherein the position of the test probes can be automatically positioned and locked in place and in which the circuit board can be replaced in a holder that is substantially moveable against the test probes.

Dice U.S. Pat. No. 4,145,620 discloses a modular-type integrated circuit burn-in apparatus including a plurality of circuit boards and a supporting rack for the boards.

SUMMARY OF THE INVENTION

One of the objects of this invention is to provide a new and improved electrical test apparatus for testing continunity of electrical connections between selected pin connectors on the card edge connectors for printed circuit boards in a rack for supporting a plurality of circuit board modules.

Another object of this invention is to provide an improved test apparatus for testing continunity of connections in circuit board racks having a plurality of signal lights, one for each of the electrical connectors, which are individually illuminated when the apparatus is energized for the circuit from any particular connector.

Still another object of this invention is to provide and improved test apparatus for printed circuit board racks having a plurality of circuits adapted to be energized separately and in sequence according to the connector pins on the card edge connector for the rack to measure the continunity of circuit connections from any selected pin.

Other objects of this invention will become apparent from time to time throughout the specification and claims as hereinafter related.

These and other objects of the invention are accomplished by an electronic test apparatus which is provided for evaluating continuity of connections between the pin connectors of a supporting rack for printed circuit boards or the like.

Circuit board racks have been provided to receive a plurality of separate modular circuit boards, each of which has a plurality of conductor fingers which fit pin connections or the like in the card (or board) edge connector at the rear of the circuit board supports. The pin connectors for each board are wired together in a selected sequence according to the circuit being constructed by the modules.

The test apparatus consists of an electronic circuit including signal lights (LEDs) associated with each pin on card edge connector for the first board slot in the rack to be tested and separate electronic circuits including signal lights (LEDs) associated with each of the pins in each of the other slots in which board modules are to be inserted. When the master circuit is energized for any selected pin in the first slot, the light for that pin will be turned on and the circuit will be completed to and the lights illuminated for the pins for the other slots to which that pin is connected.

The master circuit provides for sequencing the connections to the respective pins, thus illuminating in sequence the lights corresponding to each of the pins in the first slot and the lights corresponding the the respective pins to which those pins are connected. A probe is also provided for testing continuity in the equivalent.

BRIEF DESCRIPTION OF THE DRAWINGS

FIG. 1 is isometric view of a circuit board rack with a plurality of test units installed therein, representing this invention, which units are effective to test the continuity of electrical connections in the rack between the rack and the various connector pins at the rear of the supporting slots.

FIG. 2 is a view in front elevation of the master test unit shown in FIG. 1.

FIG. 5 is a schematic view of a test apparatus including the test probe for measuring continunity to other portions of the equipment being tested.

DESCRIPTION OF THE PREFERRED EMBODIMENT

Figure 3A:
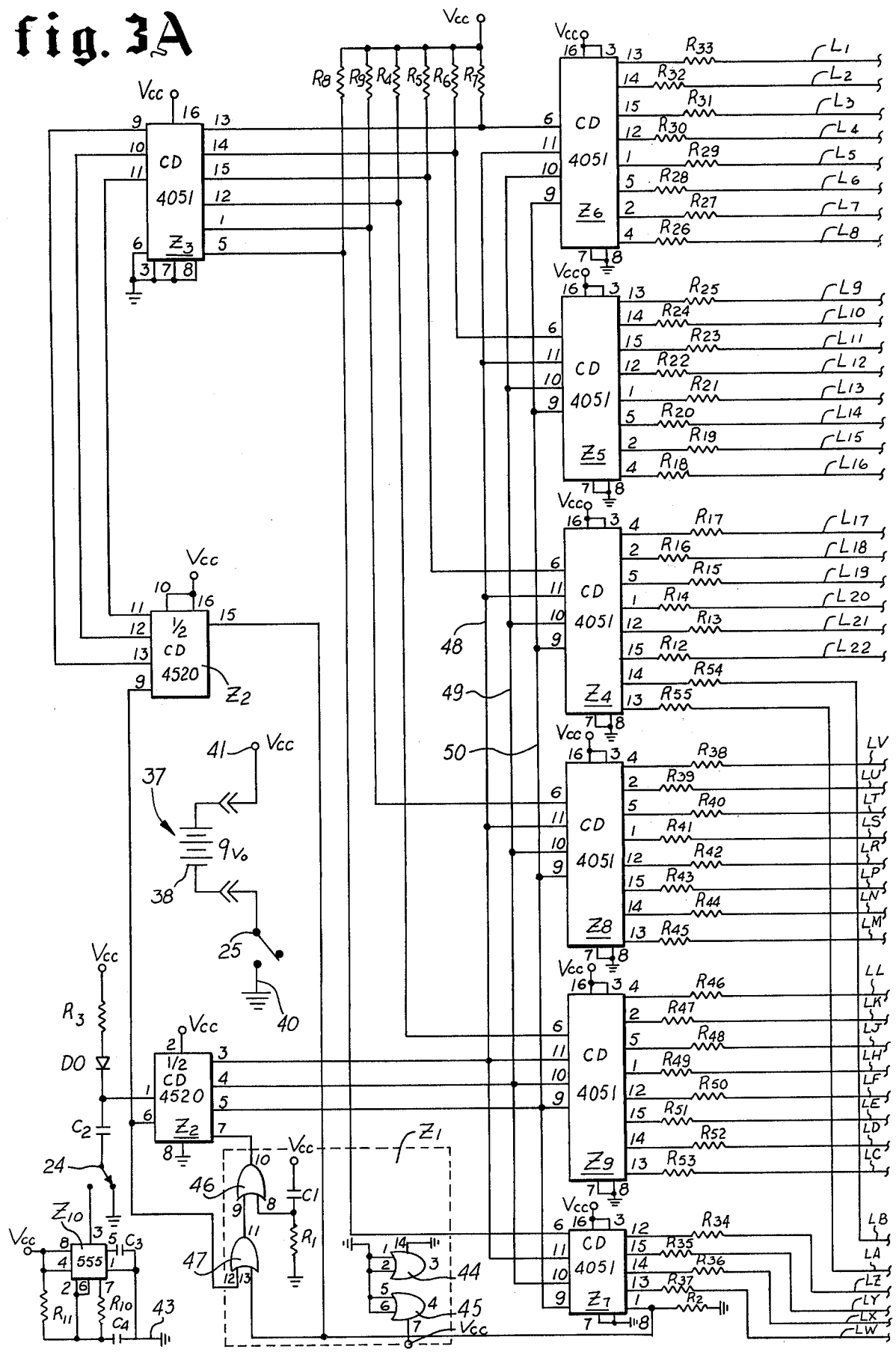
FIGS. 3a and 3b, taken together, are the electronic circuit for the master test unit shown in FIG. 2.

Referring the drawings, and more particularly to FIG. 1, there is shown a circuit board rack 10 having end walls 11 and 12 and top and bottom walls 13 and 14 which are provided with slots 15 and 16 for receiving and supporting circuit board modules in the electronic circuit. Rack 10 and the circuit board modules comprise the modular portion of an electronic apparatus. The individual circuit boards are removable for replacement and servicing. At the rear of rack 10, there are provided a plurality of spaced vertically extending card (or board) edge connectors 17 which receive the ends of the circuit boards used in the particular electronic apparatus.

Card edge connectors 17 have a plurality of connector pins 18 which correspond one to each of the electrical conductor fingers on the rear edge of the individual circuit board modules (not shown). In this particular application, rach 10 is of a size having 44 pin connectors along each of the card edge connectors 17 which correspond to 44 separate electrical conductor fingers on each of the circuit board modules.

At the rear of the rack 10 (not shown) individual pins or connectors on each of the several card edge connectors 17 are connected to other pins on other card edge connectors to provide for interconnection of the various circuit components on each of the separate circuit board modules.

This wiring is usually done by hand and is quite complex. There are a large number of wired connections which are soldered to the individual pin connectors in card edge connectors 17 to make the appropriate connections between the separate circuit components on the individual circuit board modules. It is necessary to check the wiring on the circuit board rack and, in the past, this has required manual checking of circuit continuity by use of an appropriate probe and conductivity light or conductivity meter.

The manual checking of continuity of the circuit connections is time consuming and expensive. In addition, once the rack 10 is installed in the main case for the equipment, the connections become inaccessible to check out manually. In this invention, apparatus is provided to check the circuit continunity in a semiautomatic manner without need to have access to the rear of the circuit board rack 10.

In FIG. 1, the test apparatus which forms a preferred embodiment of the invention is shown installed in circuit board rack 10. For purposes of illustration, the apparatus shown consists of three interconnected test units for testing the circuit continuity in a circuit consisting of three circuit board modules. There are 44 connectors in each of the card edge connectors 17 into which the test each of the card edge connectors 17 into which the test units (or the circuit board modules) fit.

Figure 3B:
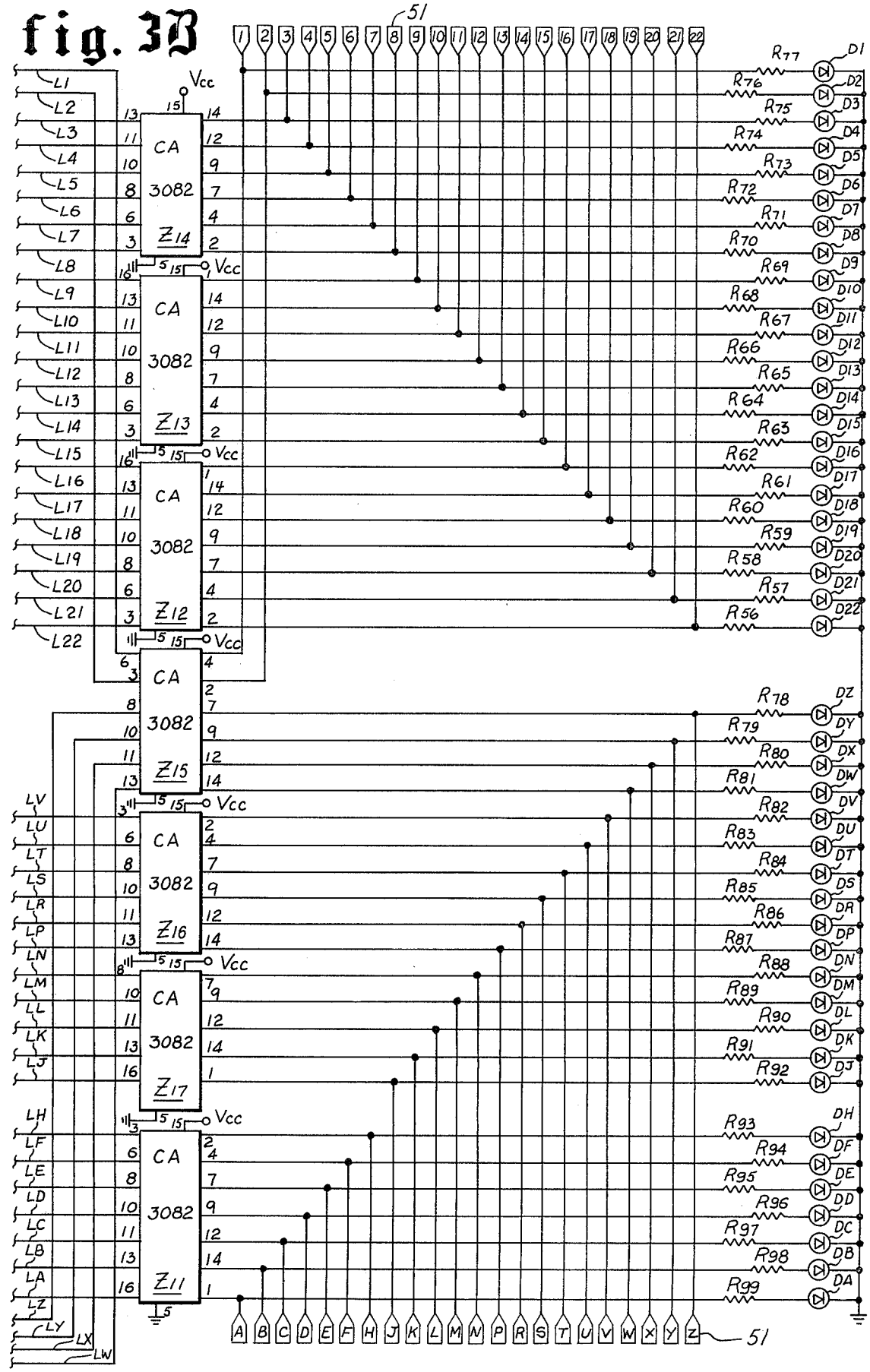

In the embodiment shown, the apparatus consists of a master (sending) test unit 19 and two slave (receiving) test units 20 and 21. Master test unit 19 comprises a supporting board 22 having a plurality of signal lights (LEDs) 23 an on-off switch 24 and a multiplexing or sequencing switch 25. in FIG. 2, it is seen that there are provided 44 of the LEDs 23 which are arranged in two columns of 22 each and correspond to the pin connectors at the rear of the rack 10. In FIG. 2, it is seen that one column of LEDs is numbered from 1 to 22 of the other column is identified by letters from A to Z (with four to letters omitted). The electrical circuit for master test unit 19 is shown in FIGS. 3a and 3b.

Master test unit 19 is provided with removable external conductor 26 which is connected to an electric probe 27. The probe circuit is described more fully in FIG. 5. The electrical components and the control switches, etc. of master unit 19 are enclosed in a suitable box shaped enclosure 29. Master test unit 19 is also connected by wire 28 to the first of the slave test units 20.

The slave units 20 and 21 have the same external appearance as the master test unit 19 except for the omission of multiplexing or sequencing switch 25 and the electrical connector 26 and probe 27. The slave units 20 and 21 consist of supporting boards or panels 30 and 31 which have box shaped enclosures 32 and 33 thereon which support the electrical switches, circuits etc.

Slave test units 20 and 21 have on-off switches 34 and 35. They are also provided with two columns of LEDs 23 which correspond to the pin connectors at the rear of circuit board rack 10. Each of the slave test units 20 and 21 therefore has two columns of 22 LEDs which correspond to the 44 pin connectors in each of the respective card edge connectors 17 at the rear of the circuit board rack 10. Slave unit 20 is connected to unit 21 by wire 36. The circuits for the master unit 19 and one of the slave units are shown in detail in the circuit diagrams of FIGS. 3a and 3b and FIG. 4 respectivly. Circuit and connections for probe 27 are shown in FIG. 5 in detail.

Figure 4:
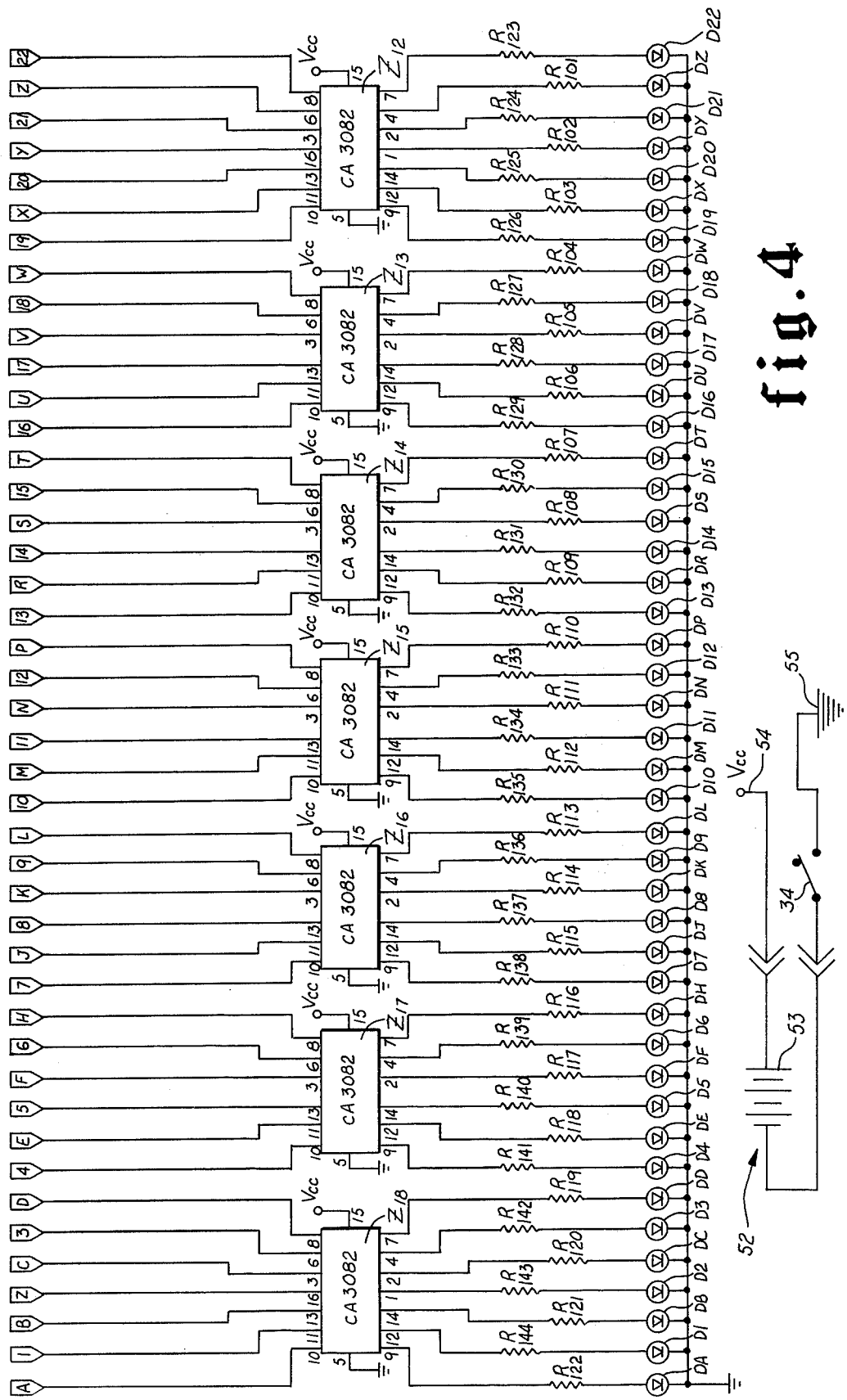
FIG. 4 is an electronic circuit diagram for the other test units shown in FIG. 1.

In the various circuit diagrams, conventional wiring schematics are used and conventional symbols are used for electronic components. The circuit diagrams in FIGS. 3A, 3B and 4 are from the manufacturers circuit diagrams used in constructing the apparatus.

In FIG. 2a, there is shown the power circuit 37 for master test unit 19. Power circuit 37 consists of a 9 volt battery 38 connected on one side to switch 25 which is connected to ground as indicated at 40. The other side of battery 38 is connected to a common circuit supply point 41 indicated as Vcc.

In the master test circuit which is supplied by power circuit 37, there are a variety of electronic components which will be described prior to describing the entire circuit assembly. A plurality of LEDs 23, identified as D1–D22 and DA–DZ are provided which correspond to the similarly numbered connections, electrical conductor fingers, to the connectors pins in card edge connector 17. The LEDs are 50 mv. size and are illuminated for indicating circuit continuity.

At the input side of the circuit, there is provided a quadruple OR gate Z1 having terminals numbered from 1 to 14 applied by the manufacturer. The quadruple OR gate is an RCA CD4071.

The sequencing or multiplexing portion of the circuit associated with switch 24 is provided with an oscillator Z10. This oscillator is an RCA #555, 0.5 Hertz, and has terminals numbered from 1 to 8 as applied by the manufacturer.

The sequencing or multiplexing portion of the circuit is provided with a 2-part, dual, binary up-counter Z2. The dual binary up-counter is an RCA CD4520 and is provided with terminals numbered from 1 to 16 applied to the unit by the manufacturer.

On the CD 4520, the terminals are as follows:

| 1. Clock A | 2. Enable A | 3. Q1 (output) A |
|---|---|---|
| 4. Q2 (output) A | 5. Q3 (output) A | 6. Q4 (output) A |
| 7. Reset A | 8. Ground | 9. Clock B |
| 10. Enable B | 11. Q1 (output) B | 12. Q2 (output) B |
| 13. Q3 (output) B | 14. Q4 (output) B | 15. Reset B |
| 16. Vcc | | |

The sequencing or multiplexing circuit also utilizes a number of single 8-channel multiplexers which are identified as Z3-Z9, inclusive. The single 8-channel multiplexers are RCA CD4051 units and are each provided with 16 numbered terminals by the manufacturer.

On the CD4051, the 16 terminals are identified as follows:

| 1. Channel 4 (output) | 2. Channel 6 (output) |
|---|---|
| 3. Common in-out | 4. Channel 7 (output) |
| 5. Channel 5 (output) | 6. Inhibit |
| 7. Vee (common emitter) | 8. Vss (ground) |
| 9. C (encoder) | 10. B (encoder) |
| 11. A (encoder) | 12. Channel 3 (output) |
| 13. Channel 0 (output) | 14. Channel 1 (output) |
| 15. Channel 2 (output) | 16. Vcc |

A number of amplifiers numbered Z11-Z16 are provided for this circuit. These amplifiers are RCA CA 3082 amplifiers. These amplifiers are NPN transistor amplifiers having 7 inputs and 7 outputs. In these amplifiers, terminal 15 is connected to Vcc and terminal 5 is connected to ground. Terminal 15 is the collector for the array of transistors. Terminals 3, 6, 8, 10, 11, 13 and 16 are base transistor terminals. Terminals 1, 2, 4, 7, 9, 12 and 14 are emitter terminals.

The master test circit will be described below with the various electronic components connected as indicated in the drawing.

Switch 24 is shown in an off position on a contact grounded as indicated at 42. Switch 24 is the sequencing or multiplexing control switch. Switch 24 is connected through capacitor C2 which is connected to one side of steering diode D0, the other side of which is connected through resistor R3 to power supply Vcc. The closed contact of switch 24 is connected to terminal 3 on oscillator Z10. Terminal 8 on the oscillator is connected to power supply Vcc and to terminal 4. Terminals 8 and 4 are connected through resistor R11 and capacitor C4 to ground as indicated at 43. Oscillator terminals 2 and 6 are also connected to capacitor C4. Terminal 7 is connected through resistor R10, to capacitor C4 and to ground 43. Capacitor C2 and steering diode D0 are connected to terminal 1 of dual binary up-counter Z2.

The quad OR gate (CD4071) Z1 has only one half of the gates in use. Gates 44 and 45 are not connected in the circuit but are connected as indicated to prevent an unbalance developing in the operation of the other components. Gates 46 and 47 are connected as shown with the output from terminal 10 connected to terminal 7 on dual binary up-counter Z2. Input terminal 8 on gate 46 is connected through resistor R1 to ground and through condensor C1 to power supply Vcc. Terminals 6 and 9 on the two halves of dual binary up-counter Z2 are connected together as indicated. Terminals 10 and 16 are connected to power supply Vcc. Terminal 15 is connected to terminal 13 of OR gate 47. Terminals 11, 12 and 13 of dual binary up-counter Z2 are connected to terminals 9, 10 and 11 of multiplexer Z3.

Multiplexer Z3 has terminal 16 connected to power supply Vcc and terminals 3, 6, 7 and 8 grounded, as indicated. On multiplexer Z3, terminals 13, 14, 15, 12, 1 and 5 are connected to terminal 6 on each of the multiplexers Z4, Z5, Z6, Z7, Z8 and Z9, and are connected thrugh resistors R7, R6, R5, R4, R9 and R8, respectively, to power supply Vcc.

Multiplexers Z4, Z5, Z6, Z7, Z8 and Z9 have terminals 11 joined by bus line 48, terminals 10 joined by bus line 49 and terminals 9 joined by bus line 50. Bus line 48 is connected to terminal 3, bus line 49 to terminal 4 and bus line 50 to terminal 5 of dual binary up-counter Z2.

As previously noted, the several multiplexers Z4-Z9, inclusive, have terminals 3 and 16 connected to power supply Vcc and terminals 7 and 8 gounded, as shown. Terminals 13, 14, 15, 12, 1, 5, 2 and 4 on each of multiplexers Z6, Z5, Z4, Z8 and Z9 and terminals 12, 15, 14 and 13 on multiplexer Z7 are connected through resistors numbered R12 to R53, inclusive, and to electric leads numbered L1 to L22 and LA to LZ, inclusive. Terminal 1 from multiplexers Z7 is connected through resistor R2 to ground and connected by an electric lead to terminal 13 on OR gate 47 and to terminal 15 on up-counter Z2. This connection provides for restarting the sequencing at LED D1 after the sequencing has reached LED DZ.

The several electric leads L1 to L22 and LA to LZ extend between the two halves of the drawings FIG. 3a and FIG. 3b, and are connected to the multiple base terminals, viz. terminals 3, 6, 8, 10, 11, 13 and 16 of the various amplifiers Z11 to Z17, inclusive. These amplifiers have terminals 15 thereof connected to power supply Vcc and terminals 5 connected to ground.

The output, i.e. emitter, terminals 1, 2, 4, 7, 9, 12 and 14 the various amplifiers (where such terminals are used) are connected by suitable electric leads including resistors numbered R56 to R99, inclusive, to the several LEDs D1-D22 and DA-DZ and to the electric terminals or connectors 51 which correspond to those numbered or lettered LEDs.

In FIG. 4, the circuits are shown for the slave (or receiving) test units 20 and 21. The slave circuit includes a power circuit 52 consisting of a 9 volt battery 53 connected on one side to common power supply terminals 54. The other side of battery 53 is connected to switch 34 (or 35) which is connected to ground as indicated at 55. The slave circuit which is powered by power circuit 52 is similar in some respects to the master circuit but utilizes only amplifiers and LEDs for registering circuit continuity in the wiring being tested.

In the slave circuit, there are provided six of the CA3082 amplifiers numbered Z12-Z18. The amplifiers have their input or base terminals 10, 11, 13, 16, 3, 6 and 8 connected to the various electrical conductor fingers which connect to pin connectors 1-22 and A-Z in the circuit board connector bracket 17. Terminal 15 on each of the amplifiers is connected to power circuit voltage Vcc and terminals 5 are grounded. The output or emitter terminals 9, 12, 14, 1, 2, 4 and 7, where used, are connected through resistors numbered R101 to R104 and to LEDs D1-D22 and DA-Dz. The slave circuit shown in this wiring diagram is operative to receive an electric signal at any of the pin connectors that are wired to a pin connector which is being energized by the master circuit. This is effective to illuminate the appropriate signal light or LED 23 corresponding to the connector pin receiving the signal from the master.

In FIG. 5, there is shown a schematic for the probe 27 which is used for testing continuity to other parts of the apparatus to which the circuit rack pin may be connected. In FIG. 5, rack 10 is shown schematically in association with master test unit 19 and slave units 20 and 21. In this diagram, wire 28 is shown connecting master to slave unit 20 and wire 36 connecting 20 to slave unit 21. The connections from rack 10 to the master and slave test units are shown schematically by dotted lines indicating the connection to circuit for the LEDs D1. Rack 10 is shown connected to terminal blocks 56, relays 57, power supply 58 and the like. Probe 27 is connected by electric lead 59 to master 19 and leads 59, 28 and 36 provide the common ground connections. Probe 27 has a signal light or LED D45 connected through amplifier 60 to probe point 61. The probe is used for checking for continuity between various connections on rack 10 and the various external connections such as terminal blocks 56, relays 57, power supply 58, etc.

OPERATION AND USE OF THE APPARATUS

As noted above, this apparatus, consisting of master test unit 19 and one or more slave units 20, 21 etc., is for the purpose of testing circuit continuity between the pin connectors and the card edge connectors provided in circuit board racks and also to check for circuit continunity between the circuit board rack and external connections such as terminal blocks, relays power supply and the like.

In the apparatus shown, rack 10 provides for only three circuit board modules and the card edge connectors provide for 44 pin connections. The apparatus can be used for testing as few as two card slots by eliminating one of the slave units shown. Likewise, the apparatus can be used for testing racks having additional slots, and their respective card edge connectors in use, by use of additional slave units. To use the apparatus for racks having more or less than 44 pin connectors in the card edge connector, it is necessary only to increase or decrease the number of LEDs used and make an appropriate adjustment in the multiplexing circuit.

In the apparatus shown, assume that rack 10 has its various card edge connectors 17 wired for a three board modular circuit. Master test unit 19 is positioned in the left hand slot and slave units 20 and 21 are inserted in the next adjacent slots thereto. The electrically conducting fingers on supporting panels 22, 30 and 31 fit into card edge connectors 17 and make contact with the connector pins therein. These connector fingers are identified as connection 51 in FIG. 3b and are numbered from 1 to 22 and from A to Z to correspond to the pins in the card edge connectors and to the numbering scheme for the two columns of LEDs on the front of each of the test units.

The circuit shown for the master test unit in FIGS. 3a and 3b is designed to reset automatically when it is turned off and on. With the equipment positioned as shown in FIG. 1, switch 25 is closed, i.e. turned to an on position, to energize power supply circuit 37 to provide power to the various supply points identified as Vcc. In this position, the circuits are energized to direct power through amplifier Z14 to energize LED D1 and to energize electrical conductor finger 1 which makes connection with the corresponding pin in card edge connector 17.

Assume that the wiring diagram for the particular modular circuit shows that pin 1 on the first card edge connector should be connected to pin 12 on the second card edge connector and to pin E on the third card edge connector. When master unit 19 is turned on, LED D1 should be lit and LED D12 should be lit on the first slave unit 20 and LED DE on the second slave unit 21. This shows that the wiring is correct for that particular pin.

Next, switch 24 is closed momentarily and then opened. This sends a pulse through the multiplexing circuit which directs the output to terminal 14 of multiplexer Z6 and thence through amplifier Z14 to connector 2 and LED D2. At this point, LED D2 will be lit in master unit 19. Assume that pin 2 should be connected to several pins on the adjacent card edge connectors 17, e.g. pins 3, 17, 21 and L on the next edge connector; pins 11, 15, 19, A and W on the third edge connector; and pins 6, 10 and X on the master unit 19. If the wiring has been done correctly, the LEDs bearing these numbers on the master unit 19 and the slave units 20 and 21, respectively, will be lit. It should be noted that master unit 19 can be used as a slave unit or receiving unit when the on/off switch is in the off position.

The operation of the test apparatus continues in this manner. A momentary operation of sequencing or multiplexing switch 24 is operable to sequence the output of the multiplexer one step at a time and to energize the signal lights (LEDs) in the master unit 19 one step at a time. The sequence followed is from 1 to 22 and then from A to Z. If the multiplexer switch 24 is operated after reaching LED DZ, the circuit reverts to its starting point and LED D1 is lit. Thus far, the multiplexer circuits and control switch 24 therefor have been described for a single step sequencing. If switch 24 is held closed, the multiplexer circuits will continue to function, due to the oscillator circuit, and the LEDs in master test unit 19 will light up rapidly in sequence until switch 24 is released. At that point, the sequencing will stop and the LED which is lit will be the number (or letter) which has been reached for the time that the switch has been held closed.

In testing the connections of rack 10, multiplexer switch 24 is operated to energize, separately and sequentially, the LEDs corresponding to the connector pins which are in use for the first circuit board module. As each of the LEDs, in turn, is lit on master 19, the LEDs on slave units 20 and 21 will be lit which correspond to the electrical connections from the pins corresponding to the respective lights (LEDs) which are lit on master unit 19. This gives a complete evaluation of circuit continuity. The failure of any particular LED to be lit indicates a failure in the circuit connection (or on rare occasion the failure of the LED). If there is a break in a circuit which should be connected, the appropriate LED on the slave units 20 or 21 will not be lit. Also, if there is a misconnection, either through error in wiring or through a shorted connection, LEDs will be lit which should not be on and will indicate an electrical connection to those pins.

Master unit 19 and slave units 20 and 21 are connected by wires 28 and 36 to provide a common ground. Probe 27 is used for checking continuity from rack 10 to various components such as relays 57, power supply 58 and terminal blocks 56. When the probe pin 61 is touched to any particular component, if there is continuity to the connections on rack 10, the probe light, LED D45, will be lit.

From the foregoing description of operation and the use it is seen that this test apparatus can be used on circuit board racks of a variety of sizes and having from two to a very large number of circuit board modules. The apparatus when used as described can be used to test the circuit board racks prior to installation in the chassis of the apparatus or after installation, since accessibility to the wiring at the edge card connectors is not required. The test apparatus, when used properly, gives a rapid and effective reading of the wiring for the circuit board rack and a rapid and accurate indication of any miswiring or shorts in the connections. The continity of electric circuits to the external components such as terminal blocks relays and power supply is easily and quickly checked by use of probe 27.

The apparatus should be turned off when not is use. Also, the batteries should be removed when the equipment is stored for long periods of time.

While this invention has been fully and completely described with special emphasis upon a single preferred embodiment, it should be understood that within the scope of the appended claims, the invention may be practiced otherwise than as specifically described herein.

I claim:

1. A test apparatus for testing circuit connections in a printed circuit board rack which supports a plurality of separate circuit board modules, each of the boards having a plurality of points of connection to connectors at the rear of the supports for the respective boards, the connectors being interwired to provide connections from selected circuit components on one of the boards to selected circuit components on the same board and on other boards, said apparatus comprising a first circuit having connections to each of the connectors for the support for one of the circuit boards, selector means for energizing said last named connectors individually, a plurality of signal lights in said circuit, corresponding in number to said last named connectors, and each being connected to be illuminated when said selector means energizes its associated connector, an additional circuit for the support for each additional circuit board to be supported in said rack, each additional circuit having connections to each of the connectors for the respective circuit board for such support, a plurality of signal lights in each of said last named circuits, corresponding in number to said last named connectors, and each being connected to be illuminated when its associated connector is energized.

2. A test apparatus according to claim 1 in which said selector means comprises means to sequence the energization of said connectors step-wise.

3. A test apparatus according to claim 2 in which said selector means can sequence the energization of said connectors both step-wise and continuously.

4. A test apparatus according to claim 3 in which said selector means includes means to reset the same to its initial point of operation after sequencing to the last connector being energized.

5. A test apparatus according to claim 4 in which said selector means further includes means to reset the same when the apparatus is turned off.

6. A test apparatus according to claim 1 in which said first circuit and each of said additional circuits are supported on boards which fit into said rack in the supports for the respective circuit board modules and include the electrical connections to the connectors for the circuit boards at the rear of the supports for the boards.

7. A test apparatus according to claim 1 in which said first circuit additionally includes an external probe and signal light illuminated on touching an object with which said rack has electrical connection for testing continuity of electrical connection from said rack to external components associated therewith.

8. A test apparatus according to claim 1 in which said signal lights comprise a plurality of LEDs, and said first circuit and said additional circuits include amplifying means for energizing said LEDs.

9. A test apparatus according to claim 8 in which said amplifying means comprises a plurality of transistor amplifiers, one for each of said LEDs in said first circuit and said additional circuits.

10. A test apparatus according to claim 9 in which said selector means comprises a multiplexer circuit and a switch controlling the same, said multiplexer circuit having a plurality of output connections, one to each of said transistor amplifiers, whereby actuation of said switch causes said LEDs to be energized step-wise or continuously.

11. A test apparatus according to claim 1 in which said transistor amplifiers in said additional circuits are positioned to amplify signals from said first circuit entering through said circuit board connectors with which said additional circuits are associated, and to energize the LEDs corresponding to such connectors.

12. A test apparatus according to claim 1 comprising a master test unit comprising a first supporting board fitting the support for one of the boards in said rack and supporting the components of said first circuit, said circuit connections comprising electrical conductor fingers fitting each of the conductors for the rack support for said one board, said signal lights comprising a plurality of LEDs supported on said supporting board, said first circuit being connected to said conductor fingers and to each of said LEDs corresponding to said fingers, said first including a plurality of transistor amplifiers, one for each of said LEDs, on said board, said selector means comprising a multiplexer circuit and a switch for energizing the same, connected to said transistor amplifiers and operable upon actuation of said switch to direct electric current to energize said LEDs and the conductor finger associated therewith both step-wise and continuously.

13. A test apparatus according to claim 12 comprising at least one slave test unit comprising a second supporting board fitting the support for one of the boards in said rack adjacent to the support for said master unit and supporting the components of said additional circuit, said circuit connections in said additional circuit comprising electrical conductor fingers fitting each of the conductors for the rack support in which said second supporting board is positioned, said signal lights in said additional circuit comprising a plurality of LEDs supported on said second supporting board, said additional circuit being connected to said conductor fingers and to each of said LEDs corresponding to said fingers, said additional circuit including a plurality of transistor amplifiers, one for each of said LEDs, on said second supporting board, and said slave test unit being operable to receive electric signals from said master unit through said conductor fingers and to energize selected amplifiers to energize and light LEDs corresponding to the wired connection from the support in which said master unit is positioned to the support in which the slave unit is positioned.

14. A test apparatus according to claim 13 in which said first circuit additionally includes an external probe connected to said circuit on said first supporting board and having a signal light illuminated by said probe touching an object with which said rack has electrical connection for testing continuity of electrical connection from said rack to external components associated therewith.

15. A component unit of a test apparatus for testing circuit connections in a printed circuit board rack which supports a plurality of separate circuit board modules, each of the boards having a plurality of points of connection to connectors at the rear of the supports for the respective boards, the connectors being interwired to provide connections from selected circuit components on one of the boards to selected circuit components on other boards, said test apparatus component unit comprising a master test unit comprising a first supporting board fitting the support for one of the boards in said rack and supporting the components of a test circuit, said circuit including connections comprising electrical connector fingers fitting each of the conductors for the rack support for said one board, a plurality of LEDs supported on said supporting board, said circuit being connected to said conductor fingers and to each of said LEDs corresponding to said fingers, said circuit including a plurality of transistor amplifiers, one for each of said LEDs, on said board, and a multiplexer circuit and a switch for energizing the same, on said supporting board, connected to said transistor amplifiers and operable upon actuation of said switch to direct electric current to energize said LEDs and the conductor finger associated therewith both step-wise and continuously.

16. A component unit of a test apparatus for testing circuit connections in a printed circuit board rack which supports a plurality of separate circuit board modules, each of the boards having a plurality of points of connection to connectors at the rear of the supports for the respective boards, the connectors being interwined to provide connections from selected circuit components on one of the boards to selected circuit components on other boards, said test apparatus component unit comprising a slave test unit for use with a master unit in said test apparatus and comprising a supporting board fitting the support for one of the boards in said rack and supporting the components of a receiving test circuit, said circuit having electrical conductor fingers fitting each of the conductors for the rack support in which said supporting board is positioned, a plurality of LEDs supported on said supporting board, said circuit being connected to said conductor fingers and to each of said LEDs corresponding to said fingers, said circuit including a plurality of transistor amplifiers, one for each of said LEDs, on said supporting board, and said slave test unit being operable when installed with a master test unit to receive electric signals from said master unit through said conductor fingers and to energize selected amplifiers to energize and light LEDs corresponding to the conductor finger through which an electric signal is received.

* * * * *